United States Patent
Bloehbaum et al.

(10) Patent No.: US 6,909,081 B2
(45) Date of Patent: Jun. 21, 2005

(54) EVALUATION CIRCUIT FOR PROCESSING THE OUTPUT OF A LIGHT DETECTOR

(75) Inventors: Frank Bloehbaum, Freiburg (DE); Axel Jahn, Waldkirch (DE)

(73) Assignee: Sick AG, Waldkirch (DE)

( * ) Notice: Subject to any disclaimer, the term of this patent is extended or adjusted under 35 U.S.C. 154(b) by 0 days.

(21) Appl. No.: 10/304,546

(22) Filed: Nov. 25, 2002

(65) Prior Publication Data

US 2003/0106989 A1 Jun. 12, 2003

(30) Foreign Application Priority Data

Dec. 11, 2001 (DE) .......................................... 101 60 626

(51) Int. Cl.$^7$ .............................................. H01J 40/14
(52) U.S. Cl. ................................................. 250/214 A
(58) Field of Search .......................... 250/208.1, 214 A, 250/214 R; 348/241

(56) References Cited

U.S. PATENT DOCUMENTS

| | | | |
|---|---|---|---|
| 5,508,836 A | * | 4/1996 | DeCaro et al. ............. 398/202 |
| 5,742,046 A | | 4/1998 | Reele |
| 5,994,960 A | | 11/1999 | Baschirotto et al. |
| 5,998,779 A | * | 12/1999 | Kozuka .................... 250/208.1 |
| 6,067,113 A | | 5/2000 | Hurwitz et al. |
| 6,121,843 A | | 9/2000 | Vampola et al. |
| 6,455,837 B2 | * | 9/2002 | Mizuno .................. 250/214 R |

FOREIGN PATENT DOCUMENTS

| | | |
|---|---|---|
| DE | 3543666 A1 | 9/1987 |
| JP | 61-231698 A | 10/1986 |

* cited by examiner

*Primary Examiner*—Thanh X. Luu
(74) *Attorney, Agent, or Firm*—Townsend and Townsend and Crew LLP

(57) ABSTRACT

An evaluation circuit for the processing of a received differential signal of an optoelectronic circuit, in particular of a light grid, is disclosed. The evaluation circuit has at least one differential amplifier for the amplification of the received signal. A clamping circuit, by which at least one output of the differential amplifier can be switched to a reference potential, is provided for the suppression of an offset of the differential amplifier. The invention further relates to a corresponding optoelectronic sensor and to a signal processing method.

33 Claims, 5 Drawing Sheets

EVALUATION CIRCUIT FOR PROCESSING THE OUTPUT OF A LIGHT DETECTOR

BACKGROUND OF THE INVENTION

The invention relates to an evaluation circuit for the processing of a received differential signal of an optoelectronic sensor, in particular of a light grid, at least having one differential amplifier for the amplification of the received signal. The invention further relates to a corresponding signal processing method.

The use of light grids is known in automation engineering and safety engineering in which a plurality of parallel light rays are periodically transmitted and monitored to carry out an areal monitoring. The received signal of each light ray is ultimately compared with a threshold value within a simple comparator stage in order to trigger an object detection signal or a switch-off signal when the threshold is not reached or is exceeded. The signal processing chain on the reception side typically contains a photodiode as the light receiver, a transimpedance amplifier with a band-pass property, a differential amplifier stage and the comparator stage for each reception channel.

With respect to the plurality of the reception channels, the most cost favorable realization of the evaluation electronics is desired. It is therefore desirable to combine the analog received signal processing for each reception channel at least in part in one integrated circuit, with these circuits being connected parallel to an analog bus and with one single common comparator stage being provided for all reception channels of this analog bus for the further reduction of the manufacturing effort.

These integrated circuits can, however, have comparatively large tolerances as a result of production spreads so that the differential output stage can have an unwanted difference in the output current signals with a short-circuited input. This offset can, in particular with a further amplification, result in the predetermined threshold being accidentally exceeded at the associated light receiver even without any incident light and thus, for example, no switch-off signal being triggered despite the interruption of the light ray in question.

This danger could admittedly be eliminated in that a high pass is interposed before the comparator stage. However, it has been found to be difficult to find a cut-off frequency for this high pass which satisfies the demands of the total system. Too low a cut-off frequency can result in the variation of the respective offset likewise being transmitted up to the comparator stage and a switching of the comparator being effected there on a switch-over between the different reception channels. A high cut-off frequency of the high pass, on the other hand, necessarily lies in the transmission range of the band-pass of the reception channel or of the integrated circuit. Its band-pass limits are also necessarily subjected to large fluctuations. The interaction with the interposed high pass can therefore result in a band-pass of a higher order with a non-defined transmission function so that the spikes resulting therefrom in the time range can in turn trigger an unintentional switching of the comparator stage.

SUMMARY OF THE INVENTION

It is an object of the invention to further improve the detection reliability with a cost favorable manufacture.

This object is satisfied for an evaluation circuit of the kind initially named in that the evaluation circuit has a clamping circuit to suppress an offset of the differential amplifier, with at least one output of the differential amplifier being able to be switched to a reference potential by the clamping circuit.

The object is satisfied for a corresponding signal processing method in that at least one output of the differential amplifier is switched to a reference potential by activation of a clamping circuit.

The basic idea of the invention therefore consists of the use of a clamping circuit for the suppression of an offset at a differential output stage of a reception channel of an optoelectronic sensor. The realization of a plurality of reception channels within a respective integrated circuit is promoted by the invention, since the key figure tolerances which are inevitable in a mass production do not result in unwanted faulty detections. The evaluation circuit in accordance with the invention and the signal processing method in accordance with the invention can thus be realized even for a plurality of reception channels in a cost favorable manner and without impairment of the reliability of the threshold comparison.

A particular advantage of the invention also consists of the fact that the switching of the differential output stage to the reference potential can take place with an electronically separated, but still activated input stage; this functionally corresponds to a fault elimination with a "closed aperture". It is thereby ensured that the clamping circuit is not clamped to possible optical interference signals and thus triggers malfunctions.

A further advantage of the invention consists of the fact that it makes possible a comparatively high clock rate with respect to the switching over or to the successive activation of the individual reception channels. For the achievement of the desired detection reliability, the setting of particularly tight coincident expected time windows, and the herewith associated waiting for the decay of a possible offset with a comparatively long time constant, is not required.

In a preferred embodiment of the invention, the at least one output of the differential amplifier is switched to the reference potential for the length of a specific time interval by activation and subsequent deactivation of the clamping circuit. An impairment of the actual desired signal of the relevant receiver signal is avoided by the deactivation of the clamping circuit.

It is furthermore preferred for the function of the suppression of an offset for two differential outputs of the differential amplifier to be able to be clamped to the reference potential, and indeed in particular to the same reference potential.

It is preferred with respect to the realization of the clamping circuit for this to have at least one electronic switch. Two switches are preferably provided which are associated with a respective differential output of the differential amplifier and are substantially symmetrically arranged with respect to these outputs.

The clamping circuit can furthermore have at least one storage device by which the reference potential can be at least partly stored at the output or the outputs of the differential amplifier. Two such storage devices are preferably provided which are associated with a respective differential output of the differential amplifier, are arranged substantially symmetrically with respect to these outputs and have substantially the same dimensions. In a preferred embodiment, the two storage devices are switched—at least temporarily—to a common reference potential.

The storage device is preferably formed by a storage capacitor. This storage capacitor can be arranged in series within the signal processing chain of the relevant reception channel; that is, it can function as a blocking capacitor.

The differential amplifier can be connected at the output side—directly or indirectly for example via the clamping circuit—to a post-amplifier and/or the already mentioned comparator. Moreover, the evaluation circuit in accordance with the invention can have a receiver—in particular a photodiode, a downstream transimpedance amplifier, a band-pass and/or a background light suppression circuit.

In a preferred embodiment of the invention, the evaluation circuit has a plurality of reception channels, for example at least eight, in particular at least a hundred reception channels. These reception channels—at least some of them in each case—can be combined to form an analog bus which is connected to a common output stage for all reception channels.

The reception channels can preferably be successively activated—in accordance with a transmitted light impulse cycle—for example by activation of a respectively associated electronic circuit or by activation of a respectively associated amplifier stage, with the received signals of the reception channels being able to be processed successively in each case, in particular compared with a threshold.

Each reception channel can have its own differential amplifier, and in particular also its own light receiver, its own transimpedance amplifier, its own band-pass and/or its own background light suppression circuit.

It is also possible for a respective clamping circuit and/or a respective post-amplifier to be provided for each reception channel. However, it is preferred—in favor of a reduction of the required electronic components—for not only a common comparator to be provided for all reception channels, but also a common clamping circuit and/or a common post-amplifier.

For a particularly cost favorable manufacture, the evaluation circuit can be made, at least in part, in particular for each reception channel, in an integrated design.

It is preferred with respect to the time sequence of the activation of a reception channel for the clamping circuit to be activated after the upstream differential amplifier has been activated and damped. The light receiver of the relevant reception channel is preferably only connected to the differential amplifier when the clamping circuit has been deactivated again. The output signal of the differential amplifier can subsequently be compared with the threshold in the comparator.

The invention thus also relates to a complete optoelectronic sensor, in particular to a light grid, comprising one or more transmitters for the transmission of transmitted light and comprising at least one, preferably a plurality of, receivers for the reception of the transmitted light and for the output of a corresponding received signal, with this sensor having an evaluation circuit of the kind explained.

The invention will be explained in the following by way of example with reference to the drawings.

DESCRIPTION OF THE PREFERRED EMBODIMENTS

Figure 1:
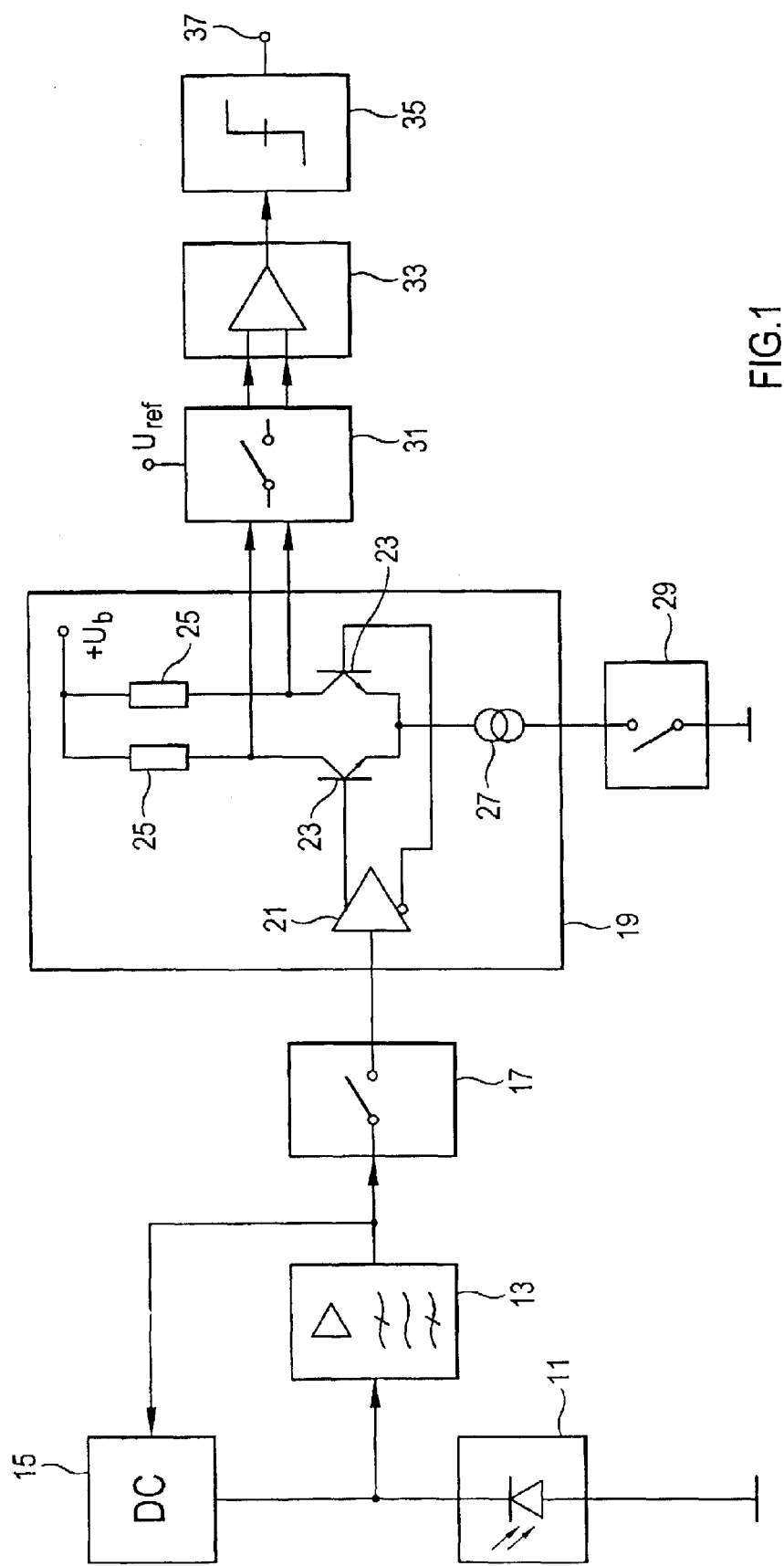
FIG. 1 shows an evaluation circuit comprising a reception channel.

FIG. 1 shows an evaluation circuit in accordance with the invention for a reception channel of a light grid 10 formed by light transmitters 12 which direct light towards associated optoelectronic receivers in the form of a photodiode 11 at the input side of the evaluation circuit. The photodiode 11 is connected on the output side to a transimpedance amplifier 13 which simultaneously functions as a band-pass. The transimpedance amplifier 13 is fed back via a background light suppression circuit 15. This circuit 15 thus forms a feedback loop by which the influence of the background light detected by the photodiode 11 is suppressed in that a corresponding current with a negative sign is fed into the input of the transimpedance amplifier 13 as a result of a comparison with a desired voltage.

On the output side, the transimpedance amplifier 13 is connected via a switch 17 to a differential amplifier 19 which has an input stage 21 and an output stage. This output stage has two amplification transistors 23 in a known symmetrical arrangement whose collectors are fed via a respective resistor 25 from a common operating voltage $U_b$ and whose emitters are connected to a power source 27. The power source 27 can be switched on and off via a switch 29.

The amplification of the received signal of the photodiode 11 within the transimpedance amplifier 13 with a band-pass thus initially takes place in an asymmetrical manner and subsequently—namely from the input stage 21 of the differential amplifier 19—symmetrically.

The two differential output signals of the differential amplifier 19 are delivered to a clamping circuit 31 which is supplied with a reference potential $U_{ref}$ and whose more precise structure and function will be explained below.

The two received differential signals amplified in this manner are subsequently supplied to a post-amplifier 33 which forwards a post-amplified asymmetrical output signal to a comparator 35. The comparator 35 delivers a warning signal or a switch-off signal at its output 37 if the signal of the post-amplifier 33 does not reach a predetermined threshold value within an expected time window.

Figure 2:
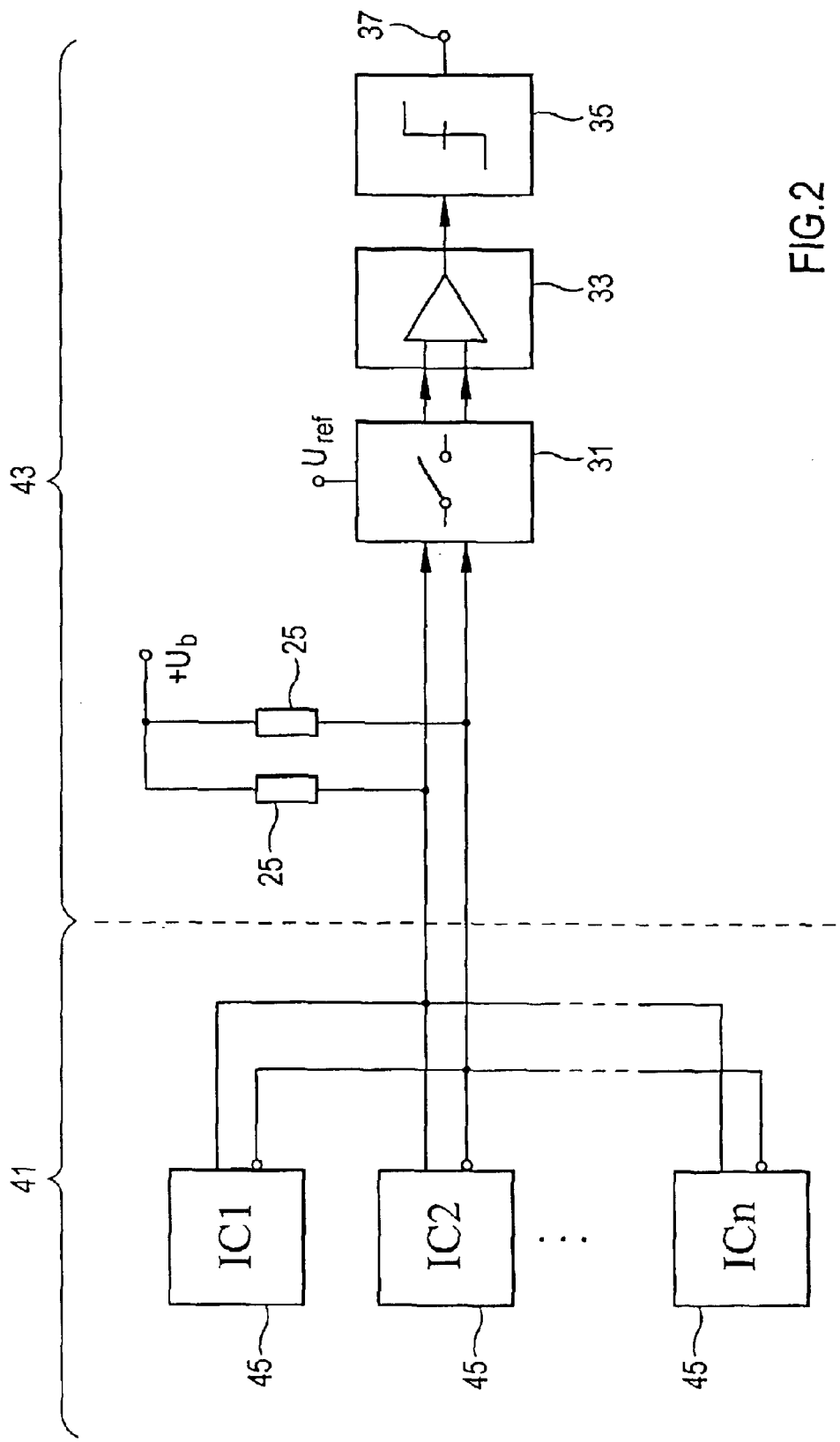
FIG. 2 shows an evaluation circuit comprising a plurality of reception channels.

The production and processing of a received signal basically takes place as follows within the evaluation circuit in accordance with FIG. 1;

First, a light impulse is generated by means of a light transmitter of the light grid which is not shown in FIG. 2 and which is associated with the photodiode 11. If this light impulse reaches the photodiode 11 without interference, that is, without an interruption of the light ray, the photodiode 11 generates an impulse-like received signal.

This received signal is amplified and filtered within the transimpedance amplifier 13. With the switch 17 closed and with the differential amplifier 19 switched on by means of the switch 29, the received signal is further amplified and is-post-amplified by means of the post-amplifier 33. Finally, a check is made by means of the comparator 35 as to whether the received signal amplified in this manner exceeds a predetermined threshold.

If, in contrast, the ray path is interrupted, that is, if, for example, an unauthorized intervention at a corresponding point of the monitored zone of the light grid takes place, then a determination is made at the comparator 35 that no sufficiently high received signal is present within an expected time window synchronized with the transmission of the light impulse. In this case, the comparator 35 outputs the already mentioned warning signal or switch-off signal.

In the explained processing of the received signal, the clamping circuit 31 brings about a suppression of an interfering influence of a possible offset at the output of the differential amplifier 19. If, namely, the differential amplifier 19 has comparatively high key figure tolerances of its components for the purpose of a cost favorable manufacture in large volumes, the differential output of the differential amplifier 19 can have an offset, that is, a current differential, even if no signal at all is applied to the input of the amplifier 19 or if the input is short circuited. So that such an offset does not bring about a supposed detection of a received signal by the comparator 35 as a result of its post-amplification in the post-amplifier 33, the offset is suppressed by means of the clamping circuit 31.

This is done in that the two outputs of the differential amplifier 19 are clamped to the reference level Uref by means of the clamping circuit 31. As a result, only such differences of the two input signals are detected at the post-amplifier 33 which are actually due to an (amplified) received signal of the photodiode 11.

A particularly cost favorable manufacture of the explained light grid comprising a plurality of transmitter channels and associated reception channels is achieved in that the evaluation electronic system is realized, reception channel for reception channel, on a receiver board 41 and—combined for all reception channels—on a base board 43, as shown in FIG. 2. On the receiver board 41 side, an integrated circuit 45 is provided for each reception channel. Each integrated circuit 45 substantially contains the photodiode 11, the transimpedance amplifier 13 with band-pass, the background light suppression circuit 15, the switch 17 and the differential amplifier 19 with switch 29, with, however, the blocking resistors 25 with the supply of the operating voltage $U_b$ being provided at the base board 43 side.

In another respect, the base board 43 contains the clamping circuit 31, the post-amplifier 33 and the comparator 35 in common for all reception channels.

The more precise procedure of the signal processing of the light grid in accordance with FIGS. 1 and 2 on the receiver side takes place as follows:

When the light grid is switched on, the photodiodes 11, the transimpedance amplifiers 13, the background light suppression circuits 15 and the switches 17 of all reception channels, i.e. of all integrated circuits 45, are activated, with all switches 17 being open, i.e. switched off. These subassemblies always remain activated in the further course so that the function of the background light compensation is always ensured with the necessarily large time constant of the circuit 15.

To initiate the activation of the first reception channel, the switch 29 of the associated differential amplifier 19 is now closed. The output stage of this differential amplifier 19, and thus the integrated circuit 45 of the relevant reception channel, is thus activated and, after termination of the corresponding decaying process, the two outputs of the differential amplifier 19 possibly have an offset.

The two outputs of the just activated differential amplifier 19, or the two inputs of the downstream differential amplifier 33, are clamped to the same reference level $U_{ref}$ in that the clamping circuit 31 is activated. Subsequently, the clamping circuit 31 is deactivated again. The reference level is now stored with a time constant which is large in relation to the breadth of the expected received signal.

The switch 17 of the circuit 45 is subsequently closed to close the signal processing chain of the relevant received channel. After the subsequent decaying of the symmetrical input stage 21 of the differential amplifier 19, the transmitted light impulse is activated and detected by means of the associated photodiode 11. The received signal of the photodiode 11 is modified, amplified and assessed by the comparator 35 in the manner already explained.

After the end of the time interval provided for this first receiver passage, the associated switches 29 and 17 are opened again so that all switches 29, 17 of the evaluation switch of the light grid are again opened.

The evaluation time interval for the second reception channel can subsequently start, with the procedure taking place in a corresponding manner. First, the associated switch 29 is therefore closed again to activate the relevant differential amplifier 19. Subsequently, the input levels of the post-amplifier 33 are again clamped to the reference level $U_{ref}$ temporarily. Then the associated switch 17 is closed and the actual impulse signal can be transmitted and evaluated.

In this manner, all reception channels are activated and evaluated successively in a cycle.

Deviations from the time procedure described are possible. In particular, to achieve higher scanning times, the next reception channel, or the integrated circuit 45 associated with this, can already be activated during the processing and assessment of a specific reception channel. It is furthermore also possible to activate the respective differential amplifier 19 only with or after the activation of the clamping circuit 31. It is moreover also possible to already connect the photodiode 11 to the differential amplifier before the deactivation of the clamping circuit 31 by closing the switch 17.

The explained clamping circuit 31 contains at least two electronic switches and two capacitors as analog storage devices which can be realized as blocking capacitors between the analog bus formed by the receiver board 41 and the downstream differential amplifier 33 of the base board 43.

Figure 3:
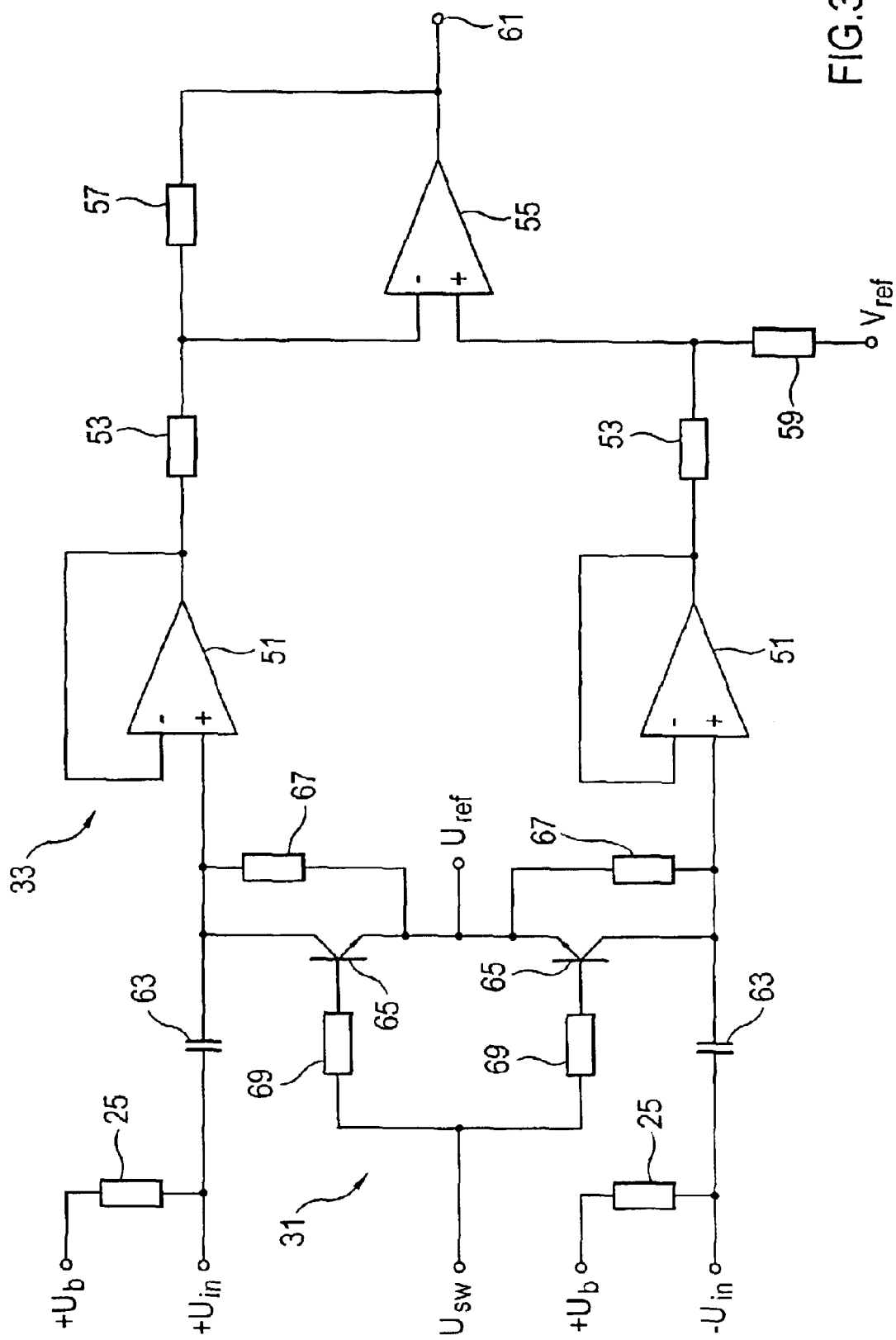
FIG. 3 shows an embodiment of a clamping circuit.

FIG. 3 shows a possible embodiment of the clamping circuit 31 in accordance with FIGS. 1 and 2. In addition to the clamping circuit 31, part of the upstream differential amplifier 19, namely the two blocking resistors 25 via which the operating voltage $U_b$ is fed in, is shown in FIG. 3 on the one hand. FIG. 3 additionally shows the downstream differential amplifier 33, on the other hand. This is formed by two operational amplifiers 51 for the impedance matching and by downstream resistors 53 in a symmetrical arrangement and—as an asymmetrical output stage—by an operational amplifier 55 having a feedback resistor 57. The positive input of the operational amplifier 55 is fed with a reference potential $V_{ref}$ via a resistor 59. The output 61 of the operational amplifier 55 is thus applied—with reference to FIGS. 1 and 2—to the comparator 35.

The actual clamping circuit 31 in accordance with FIG. 3 has two blocking capacitors 63 which serve as analog storage devices. These storage capacitors 63 are connected in series between the respective input $+U_{in}$, $-U_{in}$ of the clamping circuit 31 and the respective positive input of the symmetrical operational amplifiers 51.

Two transistors 65 serve as electronic clamping circuits. The switch transistors 65 are arranged in common with the storage capacitors 63 symmetrically to the positive and negative inputs $+U_{in}$ and $-U_{in}$ of the clamping circuit 31: The respective collector is connected to the associated storage capacitor 63 or to the positive input of the associated operational amplifier 51. The emitters of the two switch transistors 65 lie on the common reference potential $U_{ref}$ and they are further connected via a respective discharge resistor 67 to the collector or to the positive input of the respective symmetrical operational amplifier 51.

The activation and deactivation of the switch transistors 65 takes place via a respective base resistor 69 by application of a TTL switch signal to a common switch input $U_{SW}$.

The clamping circuit 31 shown in FIG. 3 works as follows:

The two switch transistors 65 are switched on (TTL "high" at switch input $U_{SW}$) to activate the clamping circuit 31. The respective positive input of the two symmetrical operational amplifiers 51 is thereby switched to the reference potential $U_{ref}$. The storage capacitors 63 are charged with a short time constant.

The switch transistors 65 are switched off (TTL "low" at the switch input $U_{SW}$) to deactivate the clamping circuit 31. On the switching off of the switch transistors 65, the reference potential $U_{ref}$ remains on the capacitor boards of the storage capacitors 63. The validity of this potential is determined by the (discharge) time constant which results from the product of the respective capacity of the storage capacitors 63 and the respective resistance value of the resistors 67. Despite the clamping which has taken place, in this state a received signal impulse supplied via the respective signal input $+U_{in}$ or $-U_{in}$ can reach the positive input of the respective operational amplifier 51 without hindrance via the relevant storage capacitor 63.

A particular advantage of the clamping circuit shown in FIG. 3 consists of the fact that the discharge final potential at the storage capacitors 63 can only change slightly with respect to the desired potential, that is, with respect to the reference potential $U_{ref}$, namely by the product of the respective bias current (pre-current) of the positive input of the operational amplifier 51 and with respect to the respective discharge resistor 67. In practice, this is only some 10 to 100 mV. Even this change is completely removed by calculation in the symmetrical dimensioning of the storage capacitors 63, of the discharge resistors 67, of the switch transistors 65 and of the symmetrical operational amplifiers 51, since it is a common mode voltage which is not amplified in the differential amplifier 33.

A further advantage of the clamping circuit 31 in accordance with FIG. 3 can be seen in the fact that this manages with just the one operating voltage $+U_b$.

Figure 4:
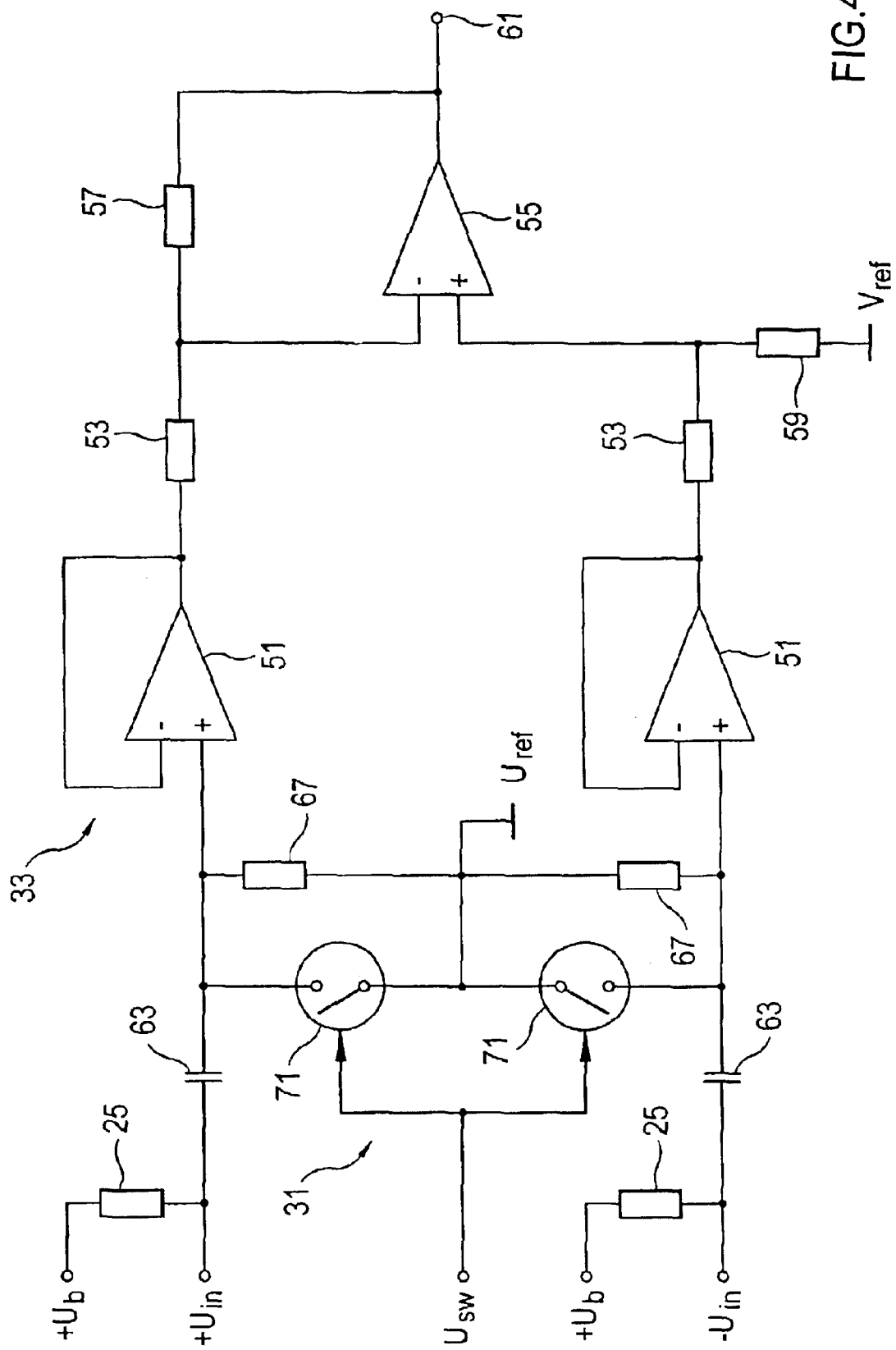
FIG. 4 shows a further embodiment of a clamping circuit.
Figure 5:
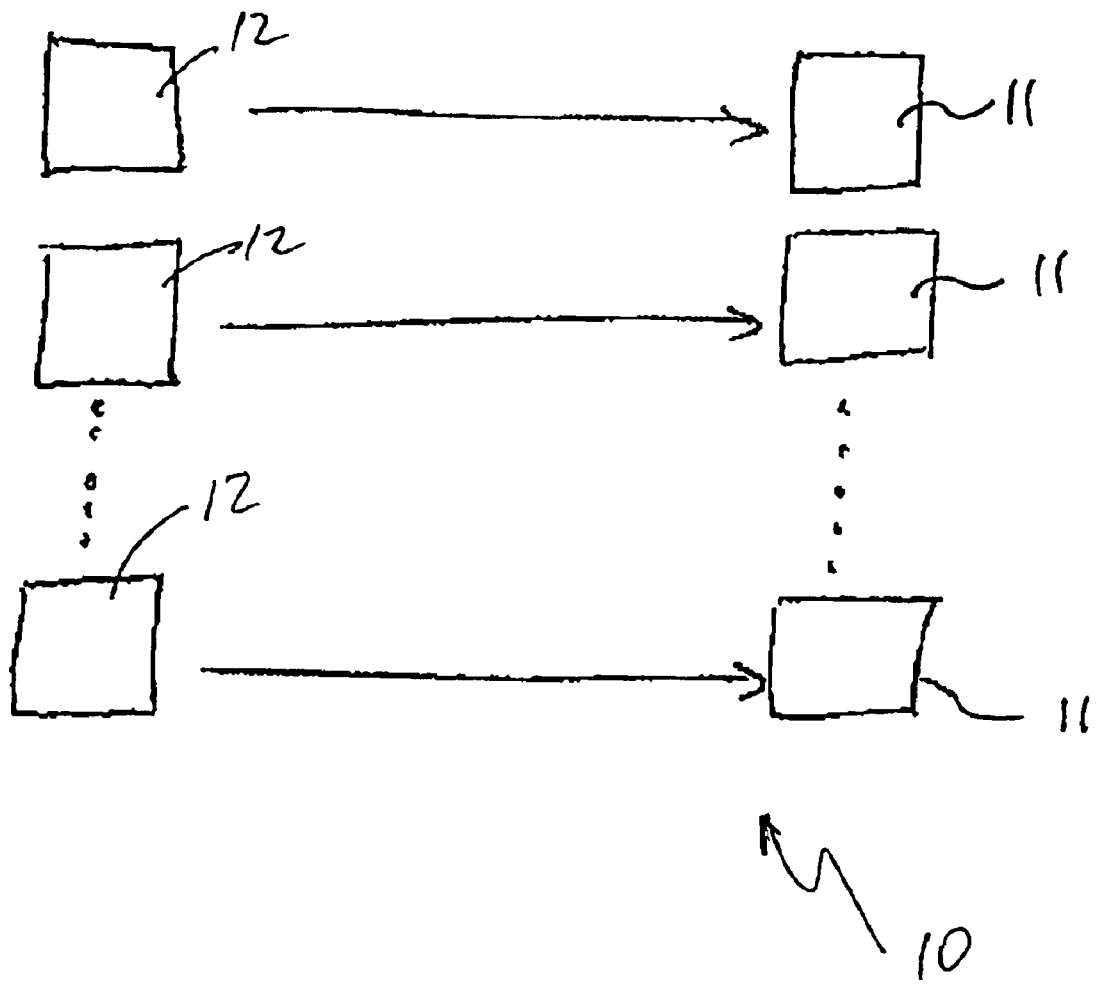
FIG. 5 is a schematic representation of a light grid.

FIG. 4 shows a further embodiment of the clamping circuit 31 in accordance with FIGS. 1 and 2 in which the reference potential $U_{ref}$ is connected to ground. This clamping circuit 31 substantially corresponds to that in accordance with FIG. 3. However, instead of the switch transistors 65, two analog switches 71 are used. Moreover, a bipolar operational voltage (not shown) is used for the analog switches 71 and for the operational amplifiers 51, 55.

It must still be noted with respect to the explained embodiments that, instead of the resistors 25, a respective power source, or a current mirror, can be used in each case as the working resistance of the differential amplifier 19 (FIG. 1).

The two operational amplifiers 51 (FIGS. 3 and 4) can also be operated with an amplification larger than one. The same amplification has to be provided to maintain the symmetry of the arrangement.

What is claimed is:

1. An evaluation circuit for the processing of a received differential signal of an optoelectronic sensor of a light grid comprising a differential amplifier for the amplification of the received signal, a post-amplifier arranged downstream of the differential amplifier and generating an asymmetrical signal, a clamping circuit disposed between the differential amplifier and the post-amplifier, the clamping circuit including two blocking capacitors which are arranged substantially symmetrically and connected in series between at least one output of the differential amplifier and at least one input of the post-amplifier and being adapted to switch the at least one input of the post-amplifier to a reference potential.

2. An evaluation circuit in accordance with claim 1 wherein an output of the post-amplifier is connected to a comparator for the comparison of an output signal with a threshold value.

3. An evaluation circuit in accordance with claim 1 wherein the evaluation circuit includes a photodiode receiver, a transimpedance amplifier, a band-pass and/or a background light suppression circuit.

4. An evaluation circuit in accordance with claim 1 wherein the evaluation circuit has a plurality of reception channels.

5. An evaluation circuit in accordance with claim 1 wherein the evaluation circuit has at least eight reception channels.

6. An evaluation circuit in accordance with claim 4 wherein the reception channels can be activated successively.

7. An evaluation circuit in accordance with claim 4 wherein one of the reception channels can be selectively activated by activation of an associated electronic switch and/or by activation of an associated differential amplifier.

8. An evaluation circuit in accordance with claim 4 wherein a differential amplifier is provided for each reception channel.

9. An evaluation circuit in accordance with claim 4 wherein a common comparator is provided for all reception channels.

10. An evaluation circuit in accordance with claim 1 wherein the clamping circuit has at least one electronic switch and at least one discharge resistor which are arranged parallel to each other between the at least one input of the post-amplifier and the reference potential.

11. An evaluation circuit in accordance with claim 10 wherein the clamping circuit has two electronic switches and two discharge resistors which are arranged symmetrically.

12. An evaluation circuit in accordance with claim 1 wherein the input of the post-amplifier can be switched to the reference potential temporarily by means of the clamping circuit.

13. An evaluation circuit in accordance with claim 1 wherein two inputs of the post-amplifier can be switched to the reference potential.

14. An evaluation circuit in accordance with claim 5 comprising at least one hundred reception channels.

15. An evaluation circuit in accordance with claim 8 further comprising a receiver, a transimpedance amplifier and a band pass and/or background light suppression circuit.

16. An evaluation circuit in accordance with claim 9 wherein the common comparator comprises a common clamping circuit and/or a common post-amplifier.

17. A method for processing a received differential signal of an optoelectronic sensor of a light grid comprising amplifying the received signal with a differential amplifier, arranging a post-amplifier downstream of the differential amplifier, generating an asymmetrical signal with the post-amplifier, placing a clamping circuit between the differential amplifier and the post-amplifier, connecting at least one blocking capacitor in series between at least one output of the differential amplifier and at least one input of the post-amplifier, and switching two inputs of the post-amplifier to a reference potential.

18. A method in accordance with claim 17 including switching the input of the post-amplifier temporarily to the reference potential.

19. A method in accordance with claim 17 including storing the reference potential at least temporarily at the input of the post-amplifier by means of the blocking capacitor.

20. A method in accordance with claim 17 including activating the differential amplifier before or after activating the clamping circuit.

21. A method in accordance with claim 17 including connecting a receiver to an input of the differential amplifier after or before deactivating of the clamping circuit, and thereafter comparing the output signal of the differential amplifier with a threshold value.

22. A method in accordance with claim 17 wherein the respective received signal of one of a plurality of reception channels is successively processed.

23. A method in accordance with claim 22 including selecting a relevant reception channel by activating an associated differential amplifier and/or by switching on an associated electronic switch.

24. A method in accordance with claim 18 wherein switching comprises temporarily activating at least one electronic switch of the clamping circuit.

25. A method in accordance with claim 21 wherein connecting the receiver to the input of the differential amplifier comprises switching an associated electronic switch.

26. A method in accordance with claim 21 wherein comparing the output signal comprises comparing a post-amplified output signal of the differential amplifier with the threshold value.

27. An optoelectronic sensor for use with a light grid comprising at least one transmitter for the transmission of transmitted light, at least one receiver for the reception of transmitted light and for outputting a corresponding received signal, and an evaluation circuit for processing the received signal including a differential amplifier for the amplification of the received signal, a post-amplifier arranged downstream of the differential amplifier and generating an asymmetrical signal, a clamping circuit disposed between the differential amplifier and the post-amplifier, the clamping circuit including two blocking capacitors which are arranged substantially symmetrically and connected in series between at least one output of the differential amplifier and at least one input of the post-amplifier and being adapted to switch the at least one input of the post-amplifier to a reference potential.

28. An evaluation circuit for the processing of a received differential signal of an optoelectronic sensor of a light grid comprising a differential amplifier for the amplification of the received signal, a post-amplifier arranged downstream of the differential amplifier and generating an asymmetrical signal, a clamping circuit disposed between the differential amplifier and the post-amplifier, the clamping circuit including at least one blocking capacitor connected in series between at least one output of the differential amplifier and at least one input of the post-amplifier and being adapted to switch the at least one input of the post-amplifier to a reference potential, wherein the clamping circuit has at least one electronic switch and at least one discharge resistor which are arranged parallel to each other between the at least one input of the post-amplifier and the reference potential.

29. An evaluation circuit in accordance with claim 28 wherein the clamping circuit has two electronic switches and two discharge resistors which are arranged symmetrically.

30. An evaluation circuit for the processing of a received differential signal of an optoelectronic sensor of a light grid comprising a differential amplifier for the amplification of the received signal, a post-amplifier arranged downstream of the differential amplifier, having two inputs and generating an asymmetrical signal, a clamping circuit disposed between the differential amplifier and the post-amplifier, the clamping circuit including at least one blocking capacitor connected in series between at least one output of the differential amplifier and at least one input of the post-amplifier and being adapted to switch the two inputs of the post-amplifier to a reference potential.

31. An evaluation circuit in accordance with claim 30 wherein the clamping circuit has two blocking capacitors with are substantially arranged symmetrically.

32. An optoelectronic sensor for use with a light grid comprising at least one transmitter for the transmission of transmitted light, at least one receiver for the reception of transmitted light and for outputting a corresponding received signal, and an evaluation circuit for processing the received signal including a differential amplifier for the amplification of the received signal, a post-amplifier arranged downstream of the differential amplifier and generating an asymmetrical signal, a clamping circuit disposed between the differential amplifier and the post-amplifier, the clamping circuit including at least one blocking capacitor connected in series between at least one output of the differential amplifier and at least one input of the post-amplifier and being adapted to switch the at least one input of the post-amplifier to a reference potential, the clamping circuit further having at least one electronic switch and at least one discharge resistor which are arranged parallel to each other between the at least one input of the post-amplifier and the reference potential.

33. An optoelectronic sensor for use with a light grid comprising at least one transmitter for the transmission of transmitted light, at least one receiver for the reception of transmitted light and for outputting a corresponding received signal, and an evaluation circuit for processing the received signal including a differential amplifier for the amplification of the received signal, a post-amplifier arranged downstream of the differential amplifier, having two inputs and generating an asymmetrical signal, a clamping circuit disposed between the differential amplifier and the post-amplifier, the clamping circuit including at least one blocking capacitor connected in series between at least one output of the differential amplifier and at least one input of the post-amplifier and being adapted to switch the two inputs of the post-amplifier to a reference potential.

* * * * *